(12) United States Patent
Dover

(10) Patent No.: US 7,644,225 B2
(45) Date of Patent: Jan. 5, 2010

(54) PERFORMANCE OR POWER-OPTIMIZED CODE/DATA STORAGE FOR NONVOLATILE MEMORIES

(75) Inventor: Lance W. Dover, Fair Oaks, CA (US)

(73) Assignee: Intel Corporation, Santa Clara, CA (US)

( * ) Notice: Subject to any disclaimer, the term of this patent is extended or adjusted under 35 U.S.C. 154(b) by 611 days.

(21) Appl. No.: 11/583,418

(22) Filed: Oct. 17, 2006

(65) Prior Publication Data

US 2008/0090604 A1 Apr. 17, 2008

(51) Int. Cl.
*G06F 12/00* (2006.01)
(52) U.S. Cl. .............. 711/103; 365/185.03; 365/185.33
(58) Field of Classification Search .................. 711/103; 365/185.03, 185.33
See application file for complete search history.

(56) References Cited

U.S. PATENT DOCUMENTS

2004/0031031 A1 2/2004 Rudelic
2004/0123054 A1 6/2004 Gould

FOREIGN PATENT DOCUMENTS

WO 2008048580 A1 4/2008

OTHER PUBLICATIONS

"International Search Report and Written Opinion of International Searching Authority", PCT/US2007/022043, Feb. 20, 2008 (10 pgs.).

*Primary Examiner*—Christian P Chace
*Assistant Examiner*—Hashem Farrokh
(74) *Attorney, Agent, or Firm*—Kacvinsky LLC

(57) ABSTRACT

A wireless device incorporates a nonvolatile memory that dynamically controls a swapping or mapping of bit pairs for a selected memory region to optimize programming times.

20 Claims, 3 Drawing Sheets

PERFORMANCE OR POWER-OPTIMIZED CODE/DATA STORAGE FOR NONVOLATILE MEMORIES

Continuous innovations in consumer applications have intensified the demand for memory storage with higher densities. Attributes inherent in flash memories satisfy the data retention needs of many consumer applications. Flash memory retains its data even when the power is removed, and using MultiLevel Cell (MLC) technology achieves the higher densities that consumers desire. MLC technology has provided lower memory cost by enabling the storage of multiple bits of data per memory cell. By adding multiple bits of information on a single memory transistor, the silicon area has been reduced and the higher density demand has been achieved. However, the MLC technology has a cost associated with programming the memory and a solution that helps to manage these costs is desired.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features, and advantages thereof, may best be understood by reference to the following detailed description when read with the accompanying drawings in which:

Figure 1:
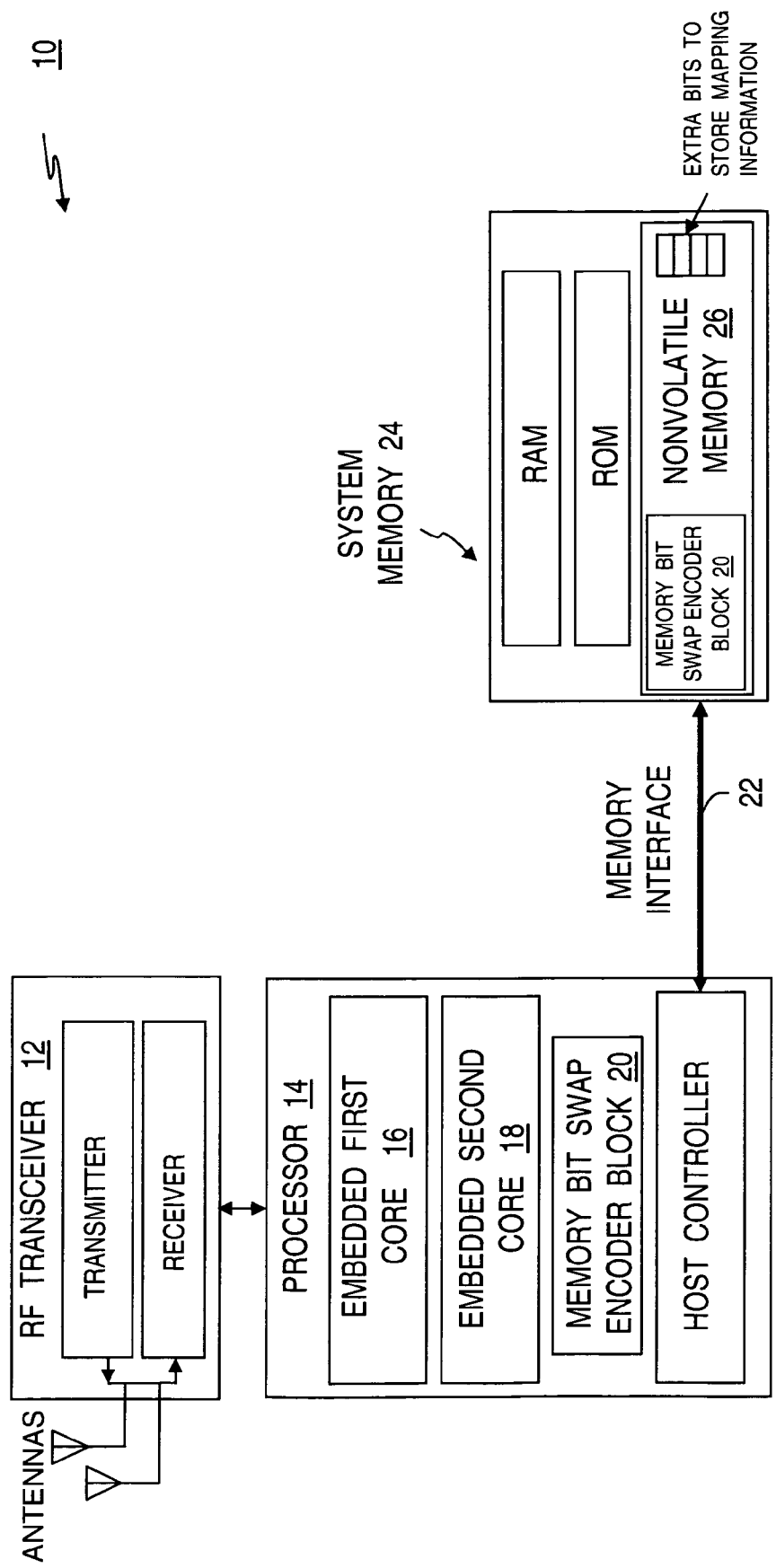
FIG. 1 is a diagram that illustrates a device that incorporates circuitry and algorithms to provide bit swap encoding to improve performance of the nonvolatile memory in accordance with the present invention.

It will be appreciated that for simplicity and clarity of illustration, elements illustrated in the figures have not necessarily been drawn to scale. For example, the dimensions of some of the elements may be exaggerated relative to other elements for clarity. Further, where considered appropriate, reference numerals have been repeated among the figures to indicate corresponding or analogous elements.

DETAILED DESCRIPTION

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

In the following description and claims, the terms "coupled" and "connected," along with their derivatives, may be used. It should be understood that these terms are not intended as synonyms for each other. Rather, in particular embodiments, "connected" may be used to indicate that two or more elements are in direct physical or electrical contact with each other while "coupled" may further mean that two or more elements are not in direct contact with each other, but yet still co-operate or interact with each other.

FIG. 1 illustrates features of the present invention that may be incorporated, for example, into a device 10. In the embodiment shown, device 10 is a wireless communications device but it should be pointed out that the present invention is not limited to wireless applications. In the wireless embodiment a transceiver 12 both receives and transmits a modulated signal from one or more antennas. The analog front end transceiver may be a stand-alone Radio Frequency (RF) integrated analog circuit, or alternatively, be embedded with a processor 14 as a mixed-mode integrated circuit. The received modulated signal may be frequency down-converted, filtered, then converted to a baseband, digital signal.

Processor 14 is connected to transceiver 12 to provide baseband and applications processing functions that may utilize one or more processor cores. Processor cores 16 and 18, in general, process functions that fetch instructions, generate decodes, find operands, and perform appropriate actions, then store results. The use of multiple cores may allow one core to be dedicated to handle application specific functions such as, for example, graphics, modem functions, etc. Alternatively, the multiple cores may allow processing workloads to be shared across the cores.

A memory controller controls a memory interface 22 that allows the processor cores and cache memory embedded within processor 14 to exchange data with a system memory 24. System memory 24 may include a combination of memories such as a disc, a Random Access Memory (RAM), a Read Only Memory (ROM) and a nonvolatile memory 26, although neither the type nor variety of memories included in system memory 24 are limitations of the present invention.

In the wireless embodiments, transceiver 12, processor 14 and nonvolatile memory 26 combine to provide solutions for a variety of applications. Typical applications that are well suited for non-volatile storage include digital video and digital still camera memory cards, USB Flash Drives, MP3 players, automobile diagnostics, GPS devices, animatronics, video game cards and toy applications. Additional applications include memory cards for printers (fonts), cell phones, telecom applications, voice mail, set-top boxes, solid state hard disk drives, HDTV, bar code scanners, and other types of handheld storage devices. As indicated, processor 14 and nonvolatile memory 26 may be incorporated into systems other than wireless applications. By way of example, processor 14 and nonvolatile memory 26 may be included together, with the claimed subject matter incorporated into applications that include desktop computers and laptops.

Nonvolatile memory 26 may be selected from a variety of storage devices such as, for example, an ETOX™ Flash NOR Memory, NAND memory, an Electrically Erasable and Programmable Read Only Memory (EEPROM), a Ferroelectric Random Access Memory (FRAM), a Polymer Ferroelectric Random Access Memory (PFRAM), a Magnetic Random Access Memory (MRAM), an Ovonics Unified Memory (OUM), a multilevel molecular memory that stores information in the form of parcels of charge at several active sites around a single molecule or any other device types capable of storing instructions and/or data and retaining that information even with device 10 in a power conservation mode. Accordingly, the scope of the present invention is not limited only to these nonvolatile memory 26 examples.

Figure 2:
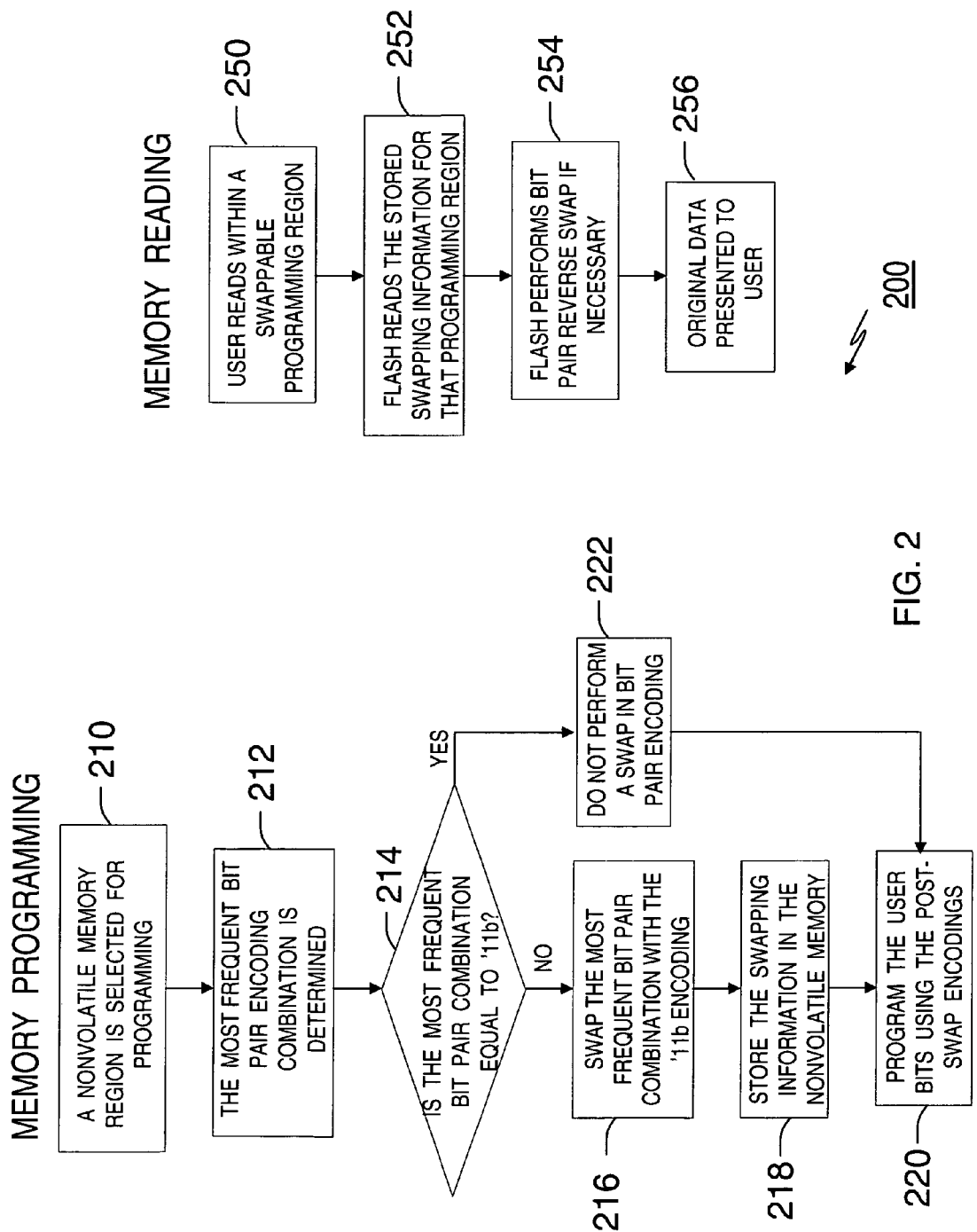
FIG. 2 is a flow diagram that illustrates a method of characterizing a nonvolatile memory region to determine a need for using the bit swap encoding and utilizing the bit swap algorithm to improve system performance in accordance with the present invention.

Processor 14 may further include a memory bit swap encoder 20, or alternatively, nonvolatile memory 26 may include the memory bit swap encoder. In accordance with the present invention, memory bit swap encoder 20 maps memory areas or regions to specific functions performed on those areas or regions. FIG. 2 provides an example that illustrates operations carried out within nonvolatile memory 26 where memory bit swapping may improve system performance. The figure illustrates the programming and reading of a memory region in the nonvolatile memory based on the different controllable bit states.

It is understood that a controlled programming technique places a precise amount of charge on the floating gate of a nonvolatile memory cell. The charge storage ability of the flash memory cell allows the storage of multiple bits in a single cell. By accurately placing charge on the floating gate to one of four charge states or ranges, the memory cell may store two bits of data. However, higher bit per cell densities are possible by even more precise charge placement control. It is pointed out that to illustrate the invention and for simplicity the table illustrates only two stored bits of data per cell, but other embodiments may store additional bits per cell, and thus, the present invention is not limited to cell densities of only two bits per cell.

Multi-Level Cell (MLC) technology enables storage of multiple bits per memory cell by charging the floating gate of a transistor to different levels that are defined by distinct flash cell threshold voltage ranges. The charge stored on the floating gate creates a voltage potential that must be overcome by a higher turn-on threshold voltage (Vt) applied to a control gate in that memory cell transistor. The amount of stored charge on the floating gate modifies the behavior of the memory cell transistor, and this stored gate charge may be detected in a memory read operation as levels of stored data.

The relationship between the four threshold voltage ranges or Vt levels stored in the flash memory cell and the corresponding logic levels may be uniquely represented by the two-bit combinations '11b, '10b, '01b and '00b. The four threshold voltage distributions translate into stored data that a memory read operation may interpret as '11b, e.g. an erased state; '10b, e.g. a partial cell programming state; '01b, e.g. a partial cell programming state; and '00b, e.g. a full cell programming state. Thus, the presence of gate charge may be interpreted as data states or discrete levels '11b, '10b, '01b and '00b.

The contents of the flash memory may be erased on a block boundary with data cleared from the flash memory with the erase operation. After erasure of the memory block to the '11b erased level, addressed memory cells may then be programmed to the '10b, '01b or the '00b programmed levels. Storing two bits per cell requires four levels defined by read reference cells. Once data is entered into the memory device it will remain, regardless of the presence or absence of power.

It should be understood that the programming time of these four levels is not the same. For instance, one of the Vt levels denoted as '11b corresponds to the "erased" condition and has the lowest programming time of the four levels. This '11b erased level is a "do-nothing" level and when storing this bit pair there is no programming action required to change the Vt of the cell. Thus, this erased condition represents the minimum time for programming compared to any of the other bit pairs. The programming to the '10b, '01b and '00b levels involves charging the floating gate of transistors of memory cells to different levels that certainly take more programming time than the '11b level.

FIG. 2 is flow diagram that describes both a programming algorithm and a reading algorithm that are used in accordance with the present invention for the nonvolatile memory 26 device illustrated in FIG. 1. Typically, code and data retained within defined regions of a nonvolatile memory are not an equal distribution of each bit pair combination. In other words, specific regions with the nonvolatile memory generally do not store an equal allocation of the '00b, '01b, '10b and '11b levels, but rather, some programmed levels have a higher propensity for one bit pair over the other bit pairs. This propensity that favors one bit pair may occur for instance, when the instruction set encoding of code in processor 14 generates more zeros than ones. It stands to reason that more '00b bit pair combinations would be scheduled for storage in the defined regions of nonvolatile memory 26 compared to the other bit pair combinations.

The present invention leverages this unequal skew that favors the generation of one bit pair combination over other bit pair combinations scheduled for programmed storage. In some embodiments, method 200, or portions thereof, is performed in normal operation by nonvolatile memory 26 to improve performance and reduce system operating power. In other embodiments, method 200, or portions thereof, may be performed by nonvolatile memory 26 in cooperation with processor 14. Note that method 200 is not limited by the particular type of apparatus, software element, or system performing the method.

Method 200 is shown beginning at process 210 in which the memory region or memory size being programmed is set within nonvolatile memory 26. In some embodiments this region may be defined as a 1K byte region, although this 1K region size is not limiting and other region sizes are envisioned. In process 212 the defined memory region is characterized to determine the most frequent bit pair encoding combination. In process 214 a decision is made as to whether the most frequent bit pair encoding combination determined in process 212 corresponds to the erased '11b level. If the most frequent bit pair encoding combination corresponds to the erased '11b level, then process 222 is performed and bit pair encoding or bit swapping does not occur. If that memory region includes a dominant bit pair combination that-directly maps to a Vt that represents the erased, e.g. do-nothing '11b level, then swapping does not occur and the algorithm proceeds to program the memory region normally.

However, if the memory region has a dominant bit pair encoding combination that is different from the erased '11b level, then the algorithm proceeds to perform process 216. Process 216 swaps the most frequent bit pair combination with the '11b encoding. Phrased differently, if the dominant bit pair combination for the memory region maps to a Vt that takes longer than the "do-nothing" erased Vt, then the memory bit swap encoder 20 swaps the bit encoding for that programming region such that the most dominant bit pair combination maps to the "do-nothing" Vt. When a swap condition is determined and process 216 occurs, nonvolatile memory 26 stores an extra two bits that describe the swap information for this programming region as indicated in process 218. The selected memory region is then programmed using the post swap encodings, see process 220.

Figure 3:
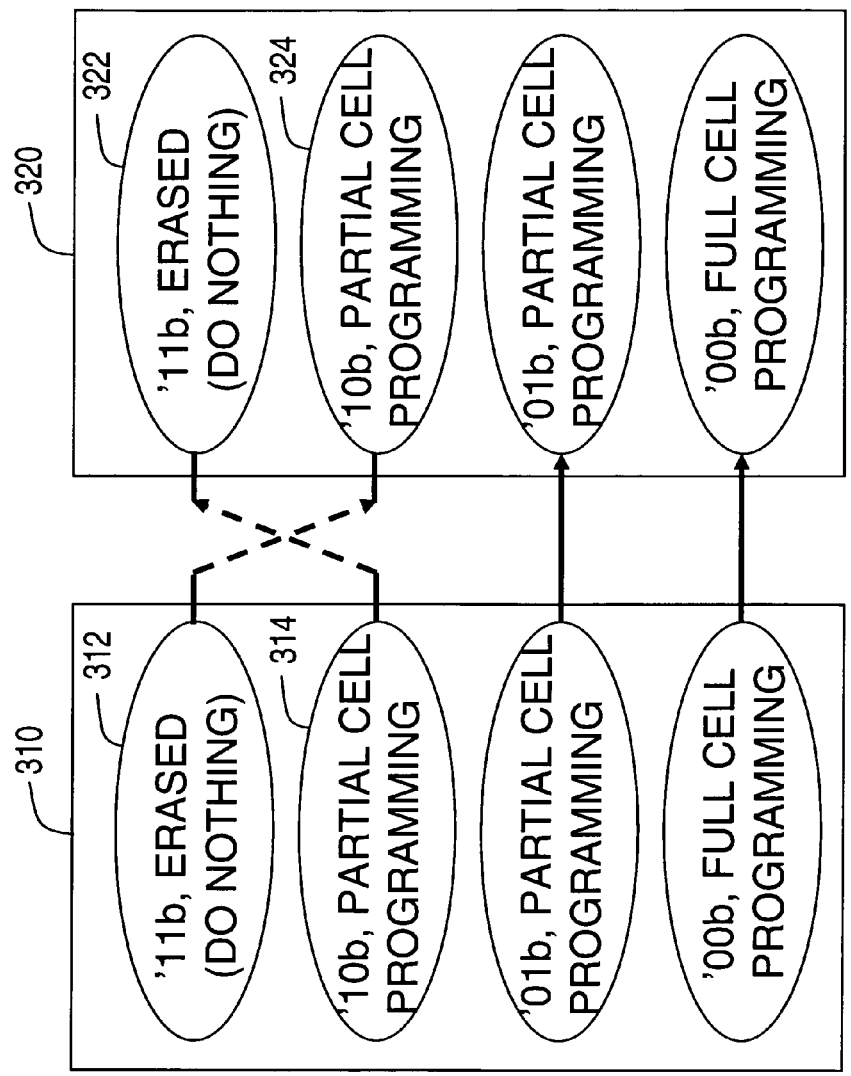
FIG. 3 is a block diagram that illustrates one example of the bit swap encoding that maps memory regions to memory programming and reading operations in accordance with the present invention.

FIG. 3 is a block diagram that illustrates one example of the bit swap encoding that maps memory regions to memory programming and reading operations in accordance with the present invention. The Vt levels of '11b, '10b, '01b and '00b in block 310 represent the bit pair combination for a nonvolatile memory region selected for programming. The Vt levels of '11b, '10b, '01b and '00b in block 320 represent the post-swap encodings (described in process 220 in the algorithm shown in FIG. 2). In this example the dominant bit pair combination for this selected memory region is determined to be '10b (corresponds to process 212 in the algorithm described in FIG. 2). Put another way, the Vt level denoted by reference number 314 represents the most frequent occurring bit pair combination for the selected memory region.

Since the most prevalent bit pair combination is not equal to the '11b bit pair (described in process 214 in the algorithm shown in FIG. 2), the '10b level is mapped or swapped with the '11b erased level to optimize programming times (described in process 216 in the algorithm shown in FIG. 2). Thus, a pre-swap bit pair combination of '10b in block 310 is mapped to a post-swap encoding of '11b in block 320 and two bits to describe the swap information are stored with the selected programming region (described in process 218 in the algorithm shown in FIG. 2). To complete the pair mapping, the x11b bit pair denoted by reference number 312 in block 310 is swapped with the '10b bit pair denoted by reference number 324 in block 320.

For simplicity only one memory swap pairing is illustrated in FIG. 3, but further swaps may be scheduled to achieve optimal programming times and to reduce system power. Thus, memory bit swap encoder 20 may map multiple swappings for each memory region. FIG. 2 further illustrates that when information stored in this programming region is read back, the extra two bits corresponding to the stored swap status for this programming region are used to reverse the Vt swap used in the programming operation in order to reproduce the original user data (see process 250, 252, 254 and 256).

Note that in flash technologies a one way programming allows bits to program from 1 to 0. Bits may program, for example, from a 0xF to 0xE to 0xC to 0x8 to 0x0 before an erase occurs. By way of another example bits may program from 0xF to 0x7 to 0x3 to 0x1 to 0x0 before an erase occurs. This one-time programming restriction is what enables level swapping. Any programming that occurs more than once breaks the ability to swap memory pairings, but imposing a restriction to only program one time within a region allows swapping. In practice, protecting data with error correction requires this one-time programming restriction. In general, error correction requires that the error corrected cells are only written. Note that if the data is written a second time the ECC parity bits may go from 0 to 1 and this transition for the parity bit data cannot be stored with a flash program operation.

By now it should be apparent that nonvolatile memory 26 may be used without intervention by processor 14 to resolve performance and power issues by managing and performing targeted bit pair combination switches associated with selected programming regions. By properly swapping the existing code, nonvolatile memory 26 may minimize performance disparities and achieve improvement in programming performance. Data bits that are not random, i.e., data bits that are not evenly distributed across all levels in the programming region, may benefit from using the swapping algorithm. However, if no level is more prevalent than another then swapping will not help. In practice, cellular code and other types of data should benefit from the swapping algorithm and improvements in the range of 7% to 37%, for example, may be realized. By optimizing for the "do-nothing" condition when programming the required programming current is reduced because a fewer number of cells need to be programmed on average.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

The invention claimed is:

1. A wireless device, comprising:
   a processor; and
   a nonvolatile memory having a memory bit swap encoder to characterize code received from the processor to find a dominant level for the code to be stored in a region of the nonvolatile memory where the swap encoder substitutes a swapped level with the dominant level before storage to reduce programming time.

2. The wireless device of claim 1 further including the swap encoder substitutes the swapped level with the dominant level before storage to reduce programming current.

3. The wireless device of claim 1 wherein the region of the nonvolatile memory further includes at least two additional memory bits to retain information about the swapped level.

4. The wireless device of claim 3 wherein the memory bit swap encoder further maps each threshold voltage range of the characterized code to optimize programming times in storing the code in the region of the nonvolatile memory.

5. The wireless device of claim 4 where a program operation stores the code in the region of the nonvolatile memory using the substituted swapped level for the dominant level and a read operation restores the code using the at least two additional memory bits.

6. A wireless device comprising:
   multiple antennas to receive an over-the-air signal;
   a transceiver to receive a modulated signal from the multiple antennas;
   a processor coupled to the transceiver; and
   a bit swap encoder to characterize programming code executed by the processor to determine a dominant level for a set memory region, where the bit swap encoder substitutes a level having a programming time that is less than a programming time associated with the dominant level to program the set memory region.

7. The wireless device of claim 6 wherein the level having a programming time that is less than a programming time associated with the dominant level is an erase level.

8. The wireless device of claim 6 wherein the dominant level is one of four threshold voltage ranges.

9. The wireless device of claim 6 wherein the level is an erase level having a programming time that is less than a programming time associated with the dominant level.

10. A wireless device comprising a nonvolatile memory having a memory bit swap encoder to characterize code before storage in a memory region to determine a dominant level and swapping the dominant level with a swapped level selected to reduce programming time.

11. The wireless device of claim 10 wherein the swapped level is an erase level having a programming time that is less than a programming time associated with the dominant level.

12. The wireless device of claim 11 wherein the memory region of the nonvolatile memory further includes at least two additional memory bits to retain mapping information about the swapped level and the dominant level.

13. The wireless device of claim 12 wherein the at least two additional memory bits are used to restore the code in a read operation of the memory region.

14. A method of using a nonvolatile memory comprising:
   characterizing threshold voltage Vt encodings for a data pattern associated with a memory region;
   choosing a dominant threshold voltage for the memory region;
   mapping an erase threshold voltage as a substitute for the dominant threshold voltage; and
   programming the data pattern in the nonvolatile memory using the erase threshold voltage substituted for the dominant threshold voltage.

15. The method of claim 14 further including storing information in the memory region that indicates mapping the erase threshold voltage as the substitute for the dominant threshold voltage.

16. The method of claim 15 further including mapping each threshold voltage to minimize programming times.

17. The method of claim 16 further including reading the data pattern stored in the memory region using the information that indicates mapping each threshold voltage.

18. A wireless device comprising:
- a processor; and
- a nonvolatile memory having a memory bit swap encoder to characterize code received from the processor to determine a prominent level associated with programming the code in a region of the nonvolatile memory, wherein the memory bit swap encoder substitutes a swapped level having a programming time that is less than a programming time associated with the prominent level.

19. The wireless device of claim 18 further including storing information in the memory region that describes a mapping of the main level with the swapped level.

20. The wireless device of claim 18 wherein the memory bit swap encoder substitutes the swapped level with the dominant level to reduce programming current.

* * * * *